US011424380B2

(12) United States Patent
Park

(10) Patent No.: US 11,424,380 B2
(45) Date of Patent: Aug. 23, 2022

(54) SUNLIGHT CONCENTRATING DEVICE AND PHOTOVOLTAIC MODULE CONTAINING THE SAME

(71) Applicant: KOREA ELECTRONICS TECHNOLOGY INSTITUTE, Seongnam-si (KR)

(72) Inventor: Kyoungwon Park, Seoul (KR)

(73) Assignee: KOREA ELECTRONICS TECHNOLOGY INSTITUTE, Seongnam-si (KR)

(*) Notice: Subject to any disclaimer, the term of this patent is extended or adjusted under 35 U.S.C. 154(b) by 0 days.

(21) Appl. No.: 17/136,747

(22) Filed: Dec. 29, 2020

(65) Prior Publication Data

US 2022/0077340 A1    Mar. 10, 2022

(30) Foreign Application Priority Data

Sep. 10, 2020    (KR) .................. 10-2020-0115888

(51) Int. Cl.
 *H02N 6/00* (2006.01)
 *H01L 31/042* (2014.01)
 *H01L 31/055* (2014.01)
 *H02S 40/22* (2014.01)

(52) U.S. Cl.
 CPC ............ *H01L 31/055* (2013.01); *H02S 40/22* (2014.12)

(58) Field of Classification Search
 CPC .... H01L 31/055; H01L 31/0547; H02S 40/22
 See application file for complete search history.

(56) References Cited

U.S. PATENT DOCUMENTS 8,153,888 B2 * 4/2012 Smith ................ H01L 31/0549
                                             136/255
9,923,514 B1 * 3/2018 Boyd ..................... H02S 40/22
(Continued)

FOREIGN PATENT DOCUMENTS

KR  10-2016-0061267 A   5/2016
KR  10-2018-0084472 A   7/2018
KR  10-2019-0101065 A   8/2019

OTHER PUBLICATIONS

Office Action dated Nov. 1, 2021, for corresponding Korean Patent Application No. 10-2020-0115888 along with an English translation.

*Primary Examiner* — Angelo Trivisonno
(74) *Attorney, Agent, or Firm* — Hauptman Ham, LLP

(57) ABSTRACT

A sunlight concentrating device may include a quantum dot layer having a first surface and a second surface opposite to each other, a first glass layer in contact with the first surface of the quantum dot layer, and a second glass layer in contact with the second surface of the quantum dot layer, and further include a low-refractive layer provided in a predetermined region of the first surface and/or the second surface of the quantum dot layer. The low-refractive layer is patterned, and a refractive index of the low-refractive layer is smaller than a refractive index of the quantum dot layer. The low-refractive layer totally reflects photons, being permeated from the quantum dot layer into the glass layer(s), between the glass layer(s) and the quantum dot layer so that the photons can move within a section with no loss of light thereby overcoming the theoretical limit of light concentration.

23 Claims, 11 Drawing Sheets

(56) References Cited

U.S. PATENT DOCUMENTS

| | | | |
|---|---|---|---|
| 2011/0226317 A1* | 9/2011 | Xu | H01L 31/022425 |
| | | | 136/255 |
| 2015/0194555 A1* | 7/2015 | Zhang | H01L 31/048 |
| | | | 250/487.1 |
| 2019/0067505 A1* | 2/2019 | Ko | H01L 31/043 |

* cited by examiner

SUNLIGHT CONCENTRATING DEVICE AND PHOTOVOLTAIC MODULE CONTAINING THE SAME

CROSS-REFERENCE TO RELATED APPLICATION(S)

This application is based on and claims priority under 35 U.S.C. 119 to Korean Patent Application No. 10-2020-0115888, filed on Sep. 10, 2020, in the Korean Intellectual Property Office, the disclosures of which are herein incorporated by reference in their entireties.

BACKGROUND

Field

The disclosure relates to a sunlight concentrating device and a photovoltaic module containing the same. More particularly, the disclosure relates to a sunlight concentrating device capable of overcoming a theoretical limit of light concentration by utilizing a patterned low-refractive layer, and to a photovoltaic module including the sunlight concentrating device.

Description of Related Art

Recently, photovoltaic power generation facilities capable of generating electric power using solar energy are gradually becoming popular. Building integrated photovoltaic (BIPV) technology that uses photovoltaic power generation facilities, such as solar photovoltaic cells, as a finishing material for buildings is attracting worldwide attention as a promising new technology in the 21st century, and was applied to the convention center of the Swiss Federal Institute of Technology in Lausanne in early 2014.

In particular, a concentrator-type photovoltaic cell can maximize the light conversion efficiency by concentrating sunlight into a small area, and when using a multi-junction photovoltaic cell and a tracking device, more than 300 times the sunlight can be concentrated. In this case, the light concentration may be expected to increase as the concentration of quantum dots increases or the thickness of a quantum dot layer increases. However, the increased concentration of the quantum dots and/or the increased thickness of the quantum dot layer may cause reabsorption of emitted photons, so there is a theoretical limit of light concentration.

Korean Patent Publication No. 10-2019-0101065 describes an increase in the efficiency of a photovoltaic cell through a multi junction structure, but there is still a problem in that the above-described theoretical limit of light concentration is not solved. Accordingly, there is a need to develop a structure capable of overcoming the theoretical limit of light concentration even under a low concentration of quantum dots and/or a small thickness of a quantum dot layer.

SUMMARY

The disclosure provides a sunlight concentrating device capable of overcoming a theoretical limit of light concentration through a quantum dot layer that includes a patterned low-refractive layer and is interposed between glass layers, and also provides a photovoltaic module including the sunlight concentrating device.

According to a first embodiment of the disclosure, a sunlight concentrating device comprises a quantum dot layer having a first surface and a second surface opposite to each other; a first glass layer in contact with the first surface of the quantum dot layer; a second glass layer in contact with the second surface of the quantum dot layer; and a low-refractive layer provided in a predetermined region of the first surface or the second surface of the quantum dot layer, wherein the low-refractive layer is patterned, and wherein a refractive index of the low-refractive layer is smaller than a refractive index of the quantum dot layer.

According to a second embodiment of the disclosure, the sunlight concentrating device of the first embodiment of the disclosure, wherein the low-refractive layer comprises a first low-refractive layer and a second low-refractive layer respectively provided in predetermined regions of the first surface and the second surface of the quantum dot layer, and wherein each of the first and second low-refractive layers is patterned, and a refractive index of each of the first and second low-refractive layers is smaller than a refractive index of the quantum dot layer.

According to a third embodiment of the disclosure, the sunlight concentrating device of the first embodiment of the disclosure, wherein the low-refractive layer comprises a first low-refractive layer and a second low-refractive layer respectively provided in predetermined regions of the first surface and the second surface of the quantum dot layer, and wherein the first low-refractive layer and the second low-refractive layer are respectively patterned on the first and second surfaces of the quantum dot layer to have complementary patterns, and wherein a refractive index of each of the first and second low-refractive layers is smaller than a refractive index of the quantum dot layer.

According to a fourth embodiment of the disclosure, a sunlight concentrating device comprises a quantum dot layer having a first surface and a second surface opposite to each other; a transparent polymer resin layer in contact with one of the first and second surfaces of the quantum dot layer; a first glass layer in contact with the transparent polymer resin layer and opposite to the quantum dot layer; a second glass layer in contact with other of the first and second surfaces of the quantum dot layer; and a low-refractive layer provided in the transparent polymer resin layer, wherein the low-refractive layer is patterned, and wherein a refractive index of the low-refractive layer is smaller than a refractive index of the quantum dot layer.

According to a fifth embodiment of the disclosure, a photovoltaic module comprises a plurality of solar photovoltaic cells disposed in a form surrounding sides of the sunlight concentrating device of any one of the above embodiments and electrically connected thereto.

BRIEF DESCRIPTION OF THE DRAWINGS

The above and other aspects, features and advantages of certain embodiments of the disclosure will be more apparent from the following detailed description, taken in conjunction with the accompanying drawings.

DETAILED DESCRIPTION

Now, various embodiments of the disclosure will be described in detail with reference to the accompanying drawings. However, the following description is not intended to limit the disclosure to specific embodiments and should be understood to include various modifications, equivalents, and/or alternatives to such embodiments. In the following, a detailed description of known techniques will be omitted when it may make the subject matter of the disclosure rather unclear.

Terms used herein may be merely to describe a certain embodiment, and may not be intended to limit the disclosure. The singular expressions may include plural expressions unless the context clearly dictates otherwise.

In the disclosure, the terms such as "comprise", "include", and "have" denote the presence of stated elements, components, operations, functions, features, and the like, but do not exclude the presence of or a possibility of addition of one or more other elements, components, operations, functions, features, and the like.

Figure 1:
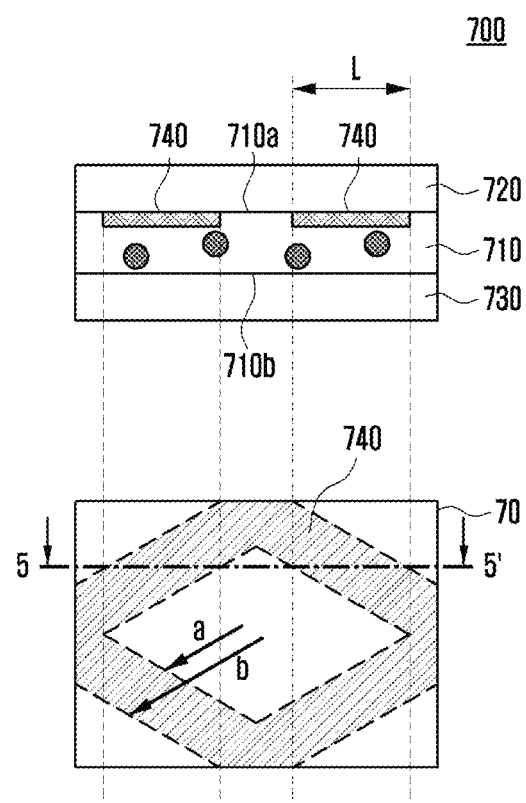
FIGS. 1 to 4 are diagrams illustrating a sunlight concentrating device composed of a quantum dot layer provided between glass layers and including a patterned low-refractive layer according to embodiments of the disclosure.

FIG. 1 is a diagram illustrating a sunlight concentrating device composed of a quantum dot layer provided between glass layers according to one embodiment of the disclosure. Specifically, in a structure of a sunlight concentrating device 700 according to the embodiment shown in FIG. 1, a quantum dot layer 710 is interposed between two glass layers 720 and 730, and a patterned low-refractive layer 740 is provided on either a first surface 710a or a second surface 710b of the quantum dot layer 710.

In the disclosure, the term 'a sunlight concentrating device' is also referred to as a luminescent solar concentrator, and means a device composed of a luminous body that absorbs incident sunlight and re-emits light (photoluminescence) with low energy. The luminous body is a material capable of emitting visible light or infrared light. The light emitted by the luminous body is totally reflected due to a difference in refractive index between the air and a glass or plastic substrate while being transferred with wave guiding property along the substrate, and then the transferred light is condensed by a solar cell and converted into electricity.

In the disclosure, the term 'quantum dot (QD)' means a single-material semiconductor or compound semiconductor composed of particles having a size ranging from one nanometer to several tens of nanometers. The quantum dot converts light energy of a specific wavelength into light energy of another wavelength.

In an embodiment of the disclosure, the quantum dot may have a core-shell structure, and each of the core and the shell may be formed of one or more layers. For example, the quantum dot may have a core-core-shell structure or a core-shell-shell structure.

In an embodiment of the disclosure, the quantum dot may be formed of Cd, Zn, In, Ga, Al, Si, and/or Hg series, that is, ternary or quaternary group II-VI semiconductor compounds, group III-V semiconductor compounds, group I-III-VI semiconductor compounds, group IV-VI semiconductor compounds, group IV elements or compounds, group II-VI, III-V, or I-III-VI compounds doped with a transition metal, group IV-VI compounds, or any combination thereof. For example, the quantum dot may be formed of CdZnS/ZnS, CdS, CdSe, CdSe/ZnS, PbS, PbSe, CdTe, ZnS, ZnSe, ZnTe, GaN, GaP, GaAs, GaSb, AN, AIP, AIAs, AISb, InP, InAs, InSb, SiC, CuInS2, AgInS2, ZnCuInS, or ZnAgInS. Also, the quantum dot may be a carbon quantum dot, a graphene quantum dot, or a perovskite ($A_1B_1X_3$, $CH_3NH_3PbI_3$) quantum dot, or be formed of perovskite-like material (AaBbXc wherein a, b, and c are integers other than 1:1:3 and satisfying a+b−c=0). Preferably, the quantum dot may be formed of $CuInS_2/ZnS$ or $CuInSe_2/ZnS$.

In an embodiment of the disclosure, an organic dye may be used instead of the quantum dot. The organic dye may be, for example, Lumogen Red (red-emitting perylenedicarboximide fluorescent agent, BASF Corporation, brand name), Lumogen Yellow (yellow-emitting perylenedicarboximide fluorescent agent, BASF Corporation, brand name), Lumogen Orange (orange-emitting perylenedicarboximide fluorescent agent, BASF Corporation, brand name), or the like.

In an embodiment of the disclosure, an inorganic phosphor may be used instead of the quantum dot. The inorganic phosphor may be, for example, EG2762, NYAG4EL, R630, R670, or the like.

In an embodiment of the disclosure, the quantum dots are contained in an amount of 1% to 50% by weight with respect to the total weight of the sunlight concentrating device 700. The quantum dots are preferably contained in an amount of 3% to 40% by weight, more preferably in an amount of 5% to 30% by weight, and most preferably in an amount of 10% to 30% by weight. When the content of the quantum dots satisfies the above range, light emission characteristics compared to the content of the quantum dots can be efficiently exhibited, and desired light guiding can be implemented. On the other hand, when the quantum dots are contained in excess of the above range, a problem in that emitted photons are reabsorbed may occur.

Referring to FIG. 1, the sunlight concentrating device 700 according to one embodiment of the disclosure includes a quantum dot layer 710 having a first surface 710a and a second surface 710b opposite to each other; a first glass layer 720 in contact with the first surface 710a of the quantum dot layer 710; a second glass layer 730 in contact with the second surface 710b of the quantum dot layer 710; and a low-refractive layer 740 provided in a predetermined region of the first surface 710a or the second surface 710b of the quantum dot layer 710. The low-refractive layer 740 is patterned. A refractive index of the low-refractive layer 740 is smaller than a refractive index of the quantum dot layer 710. Although in FIG. 1 the patterned low-refractive layer 740 is exemplarily illustrated as being provided on the first surface 710a, those skilled in the art may fully understand that the patterned low-refractive layer 740 can be provided on the second surface 710b.

In the sunlight concentrating device 700 shown in FIG. 1, the patterned low-refractive layer 740 is provided on the first surface 710a (or the second surface 710b) of the quantum dot layer 710, and totally reflects photons permeated from the quantum dot layer 710 into the glass layer 720 between the quantum dot layer 710 and the glass layer 720. Therefore, photons can move within a section L without loss of light.

Preferably, the thickness of the glass layers 720 and 730 may be 50 times or more of the thickness of the quantum dot layer 710.

Preferably, the total area of the patterned low-refractive layer 740 may correspond to a range of 5% to 95% of the total area of the first glass layer 720 or the second glass layer 730, and more preferably correspond to a range of 10% to 90%.

Meanwhile, a lower part of FIG. 1 is a top plan view 70 of the sunlight concentrating device 700, and shows one exemplary pattern of the patterned low-refractive layer 740. In this case, an upper part of FIG. 1 is a cross-sectional view taken along the line 5-5' of the view 70. In the top plan view 70 of FIG. 1, the pattern of the low-refractive layer 740 is implemented in a rhombus shape, and each side of the rhombus shape is in a diagonal direction of the upper or lower surface of the sunlight concentrating device 700 as shown exemplarily. Alternatively, each side of the rhombus shape may be in any direction other than the diagonal direction of the upper or lower surface of the sunlight concentrating device 700. In FIG. 1, 'a' denotes a length in the diagonal direction from the center to the inner side of the rhombus shape (i.e., half of the length of the inner side), and 'b' denotes a length in the diagonal direction from the center to the outer side of the rhombus shape (i.e., half of the length of the outer side). When each length of 'a' and 'b' falls within a predetermined range of a length from the center to each vertex of the upper or lower surface of the sunlight concentrating device 700, the maximum efficiency can be obtained as described later.

Figure 2:
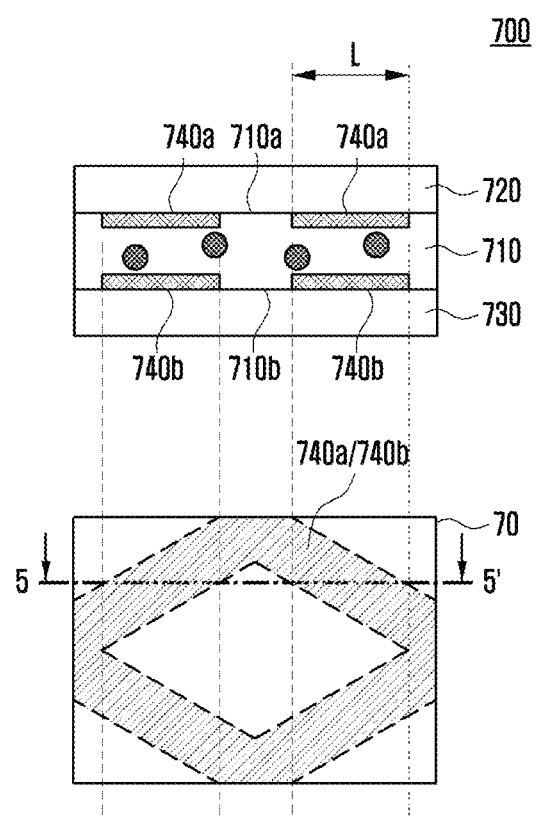

FIG. 2 shows a sunlight concentrating device 700 in which patterned low-refractive layers 740a and 740b are provided on both surfaces of a quantum dot layer 710.

Referring to FIG. 2, the sunlight concentrating device 700 according to another embodiment of the disclosure includes a quantum dot layer 710 having a first surface 710a and a second surface 710b opposite to each other; a first glass layer 720 in contact with the first surface 710a of the quantum dot layer 710; a second glass layer 730 in contact with the second surface 710b of the quantum dot layer 710; and first and second low-refractive layers 740a and 740b respectively provided in predetermined regions of the first surface 710a and the second surface 710b of the quantum dot layer 710. Each of the first and second low-refractive layers 740a and 740b is patterned. A refractive index of each of the first and second low-refractive layers 740a and 740b is smaller than a refractive index of the quantum dot layer 710.

In the sunlight concentrating device 700 shown in FIG. 2, the first and second low-refractive layers 740a and 740b may have the same or different refractive indices.

In addition, the first low-refractive layer 740a formed on the first surface 710a of the quantum dot layer 710 and the second low-refractive layer 740b formed on the second surface 710b of the quantum dot layer 710 may have the same pattern provided at facing positions.

Meanwhile, a lower part of FIG. 2 is a top plan view 70 of the sunlight concentrating device 700, and shows one exemplary pattern of each of the patterned first and second low-refractive layers 740a and 740b. In this case, an upper part of FIG. 2 is a cross-sectional view taken along the line 5-5' of the view 70.

Because the first and second low-refractive layers 740a and 740b are formed on the first surface 710a and the second surface 710b of the quantum dot layer 710, respectively, while having the same pattern provided at facing positions, the view 70 of the lower part of FIG. 2 shows each exemplary pattern of the first and second low-refractive layers 740a and 740b.

Figure 3:
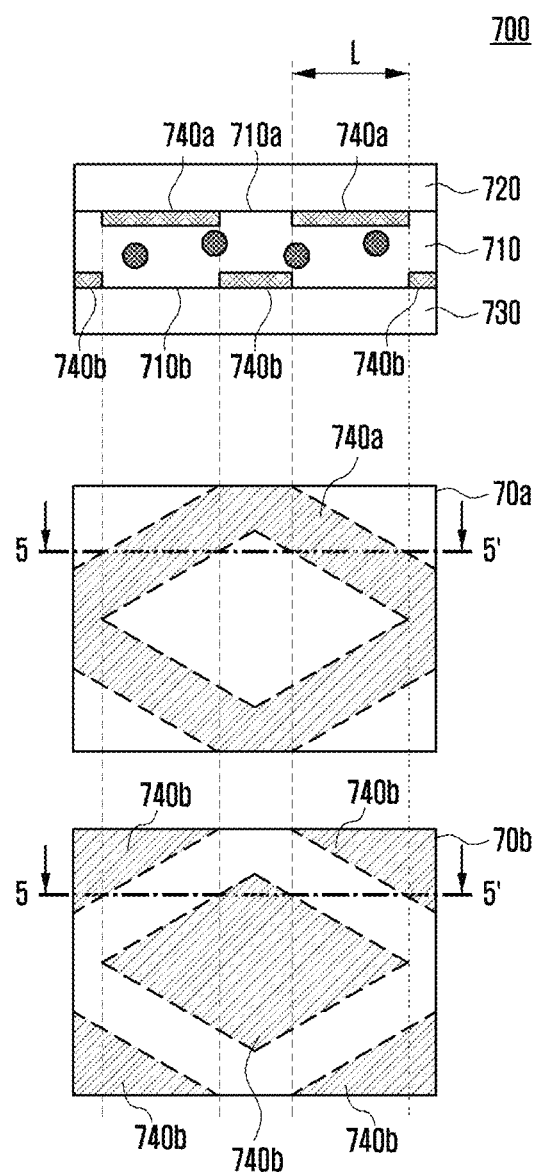

FIG. 3 shows a sunlight concentrating device 700 in which first and second low-refractive layers 740a and 740b are provided in complementary patterns on first and second surfaces 710a and 710b of a quantum dot layer 710.

Referring to FIG. 3, the sunlight concentrating device 700 according to still another embodiment of the disclosure includes a quantum dot layer 710 having a first surface 710a and a second surface 710b opposite to each other; a first glass layer 720 in contact with the first surface 710a of the quantum dot layer 710; a second glass layer 730 in contact with the second surface 710b of the quantum dot layer 710; and first and second low-refractive layers 740a and 740b respectively provided in predetermined regions of the first surface 710a and the second surface 710b of the quantum dot layer 710. The first and second low-refractive layers 740a and 740b are respectively patterned on the first and second surfaces 710a and 710b of the quantum dot layer 710 to have complementary patterns. A refractive index of each of the first and second low-refractive layers 740a and 740b is smaller than a refractive index of the quantum dot layer 710.

In the sunlight concentrating device 700 shown in FIG. 3, the first and second low-refractive layers 740a and 740b may have the same or different refractive indices.

Meanwhile, two lower parts of FIG. 3 are a top plan view 70a and a bottom plan view 70b of the sunlight concentrating device 700, and show exemplary patterns of the patterned first and second low-refractive layers 740a and 740b. In this case, an upper part of FIG. 3 is a cross-sectional view taken along the line 5-5' of the views 70a and 70b. As shown in FIG. 3, an exemplary pattern (see 70a) of the first low-refractive layer 740a and an exemplary pattern (see 70b) of the second low-refractive layer 740b are complementary to each other.

Figure 4:
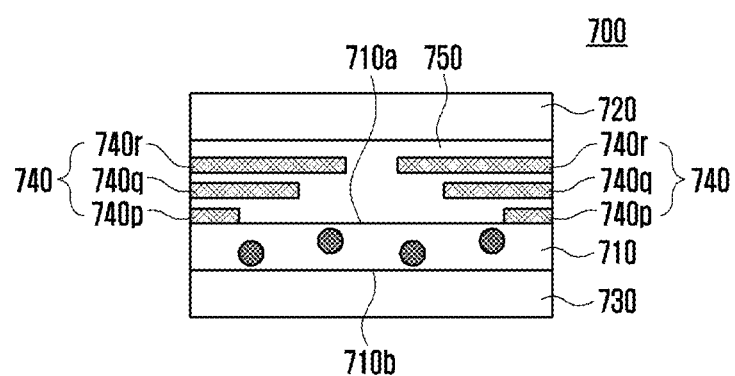

FIG. 4 is a cross-sectional view illustrating a sunlight concentrating device 700 in which a patterned low-refractive layer 740 composed of a plurality of layers 740p, 740q, and 740r vertically spaced apart from each other is provided in parallel in a transparent polymer resin layer 750 in contact with one of a first surface 710a and a second surface 710b of a quantum dot layer 710.

Referring to FIG. 4, the sunlight concentrating device 700 according to yet another embodiment of the disclosure includes a quantum dot layer 710 having a first surface 710a and a second surface 710b opposite to each other; a transparent polymer resin layer 750 in contact with one of the first and second surfaces 710a and 710b of the quantum dot layer 710; a first glass layer 720 in contact with the transparent polymer resin layer 750 and opposite to the quantum dot layer 710; a second glass layer 730 in contact with other of the first and second surfaces 710a and 710b of the quantum dot layer 710; and a low-refractive layer 740 provided in the transparent polymer resin layer 750. The low-refractive layer 740 is patterned. A refractive index of the low-refractive layer 740 is smaller than a refractive index of the quantum dot layer 710.

In the sunlight concentrating device 700 shown in FIG. 4, the low refractive-index layer 740 may be implemented as a plurality of patterned low-refractive layers 740p, 740q, and 740r provided in the transparent polymer resin layer 750 and vertically spaced apart from each other. Each of the plurality of patterned low-refractive layers 740p, 740q, and 740r has a refractive index smaller than that of the quantum dot layer 710.

Although in FIG. 4 the transparent polymer resin layer 750 is exemplarily shown as being in contact with the first surface 710a of the quantum dot layer 710, those skilled in the art may fully understand that the transparent polymer resin layer 750 can be provided to contact the second surface 710b of the quantum dot layer 710. Also, in an alternative embodiment, when the transparent polymer resin layer 750 is provided to contact the first surface 710a, another transparent polymer resin layer (not shown) may be provided to contact the second surface 710b. In the disclosure, as will be appreciated, the terms the first and second surfaces 710a and 710b are not related to specific directions.

The patterned low-refractive layer 740 may be preferably composed of 20 layers or less.

The patterns of the low-refractive layer 740 described above in embodiments of FIGS. 1 to 4 are exemplary only and not to be construed as a limitation of the disclosure. As will be appreciated by those skilled in the art, the low-refractive layer 740 according to the disclosure may have a great variety of patterns such as, for example, a circle shape, an ellipse shape, a quadrangle (square or rectangular) shape, and the like.

In addition, the patterned low-refractive layer 740 according to embodiments of FIGS. 1 to 4 is provided in general to be in contact with either or both of the first surface 710a and the second surface 710b of the quantum dot layer 710. However, the patterned low-refractive layer 740 does not necessarily have to be in contact with the first and/or second surface(s).

As described above, the refractive index of the low-refractive layer 740 has a value smaller than that of the quantum dot layer 710. Specifically, the refractive index of the low-refractive layer 740 may be 1.0 to 1.5 at 25° C., preferably 1.0 to 1.4, more preferably 1.0 to 1.3, and most preferably 1.0 to 1.2. When the refractive index of the low-refractive layer 740 satisfies the above range, the total reflection characteristic is improved, and thus the light-concentration efficiency is improved.

The low-refractive layer 740 independently includes at least one selected from the group consisting of hollow silica particles, hollow titanium dioxide particles, and fluorine-based compounds. In particular, the silica particles and the titanium dioxide particles have hollows in order to increase total reflection characteristics by lowering the refractive index. It is preferable to use the hollow silica particles because scratch resistance can be improved.

Figure 8:
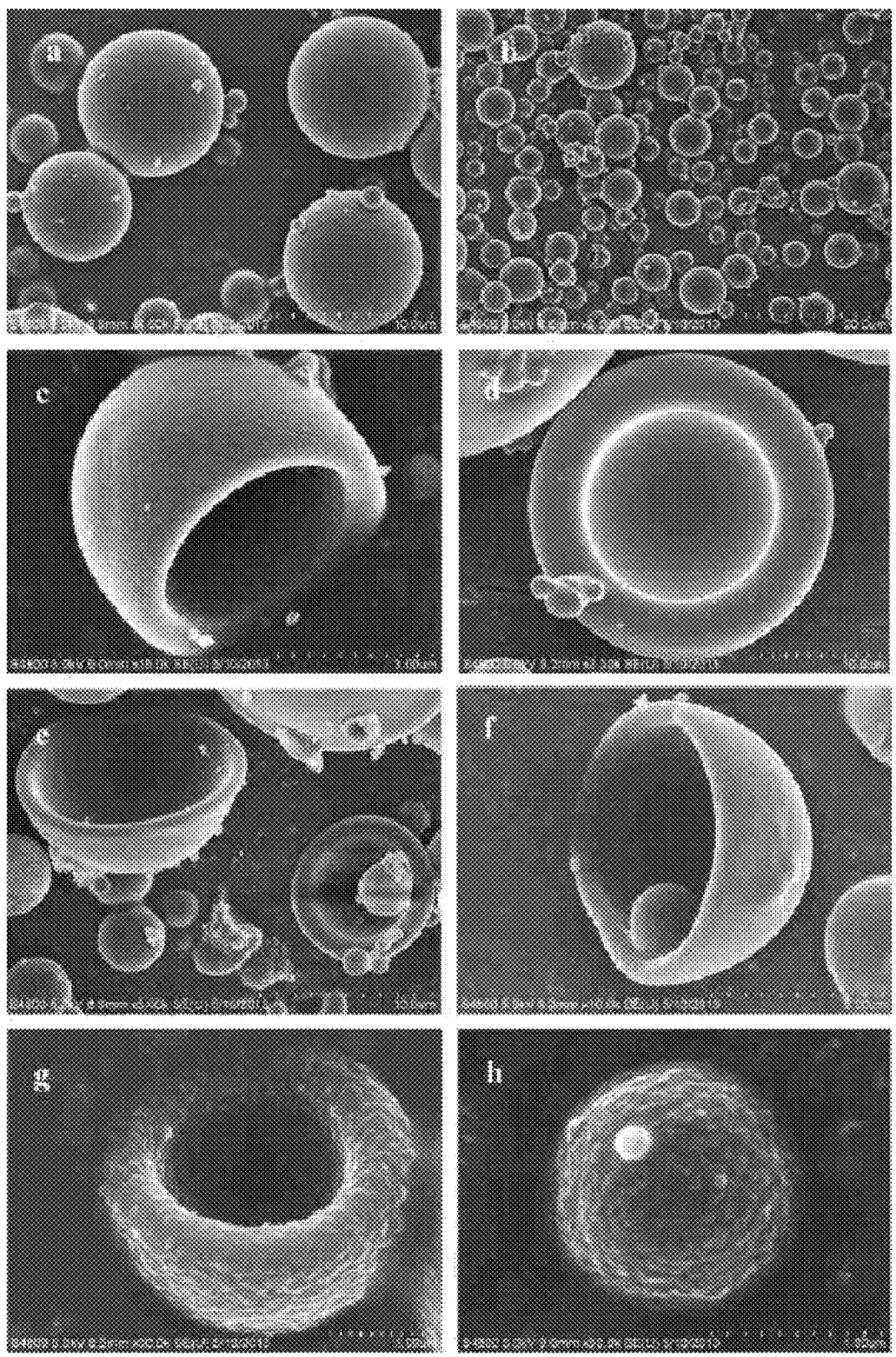
FIG. 8 is a diagram illustrating shapes of hollow silica particles according to embodiments of the disclosure.

The hollow silica particles may be crystalline particles or amorphous particles, and are preferably monodisperse particles. In terms of shape, spherical particles are preferable, but irregular particles may be used without limitation. FIG. 8 shows some pictures of hollow silica particles according to embodiments of the disclosure taken at different magnifications with a scanning electron microscope (SEM).

In embodiments of the disclosure, the number average particle diameter of the hollow silica particles is 30 nm to 10 μm. The number average particle diameter is preferably 30 nm to 5 μm, more preferably 50 nm to 2 μm, and most preferably 50 nm to 1 μm. When the number average particle diameter satisfies the above range, the ratio of a hollow portion is increased, and fine irregularities are formed on the surface. This can improve a low refractive index, thereby achieving optimum total reflection efficiency.

Figure 5A:
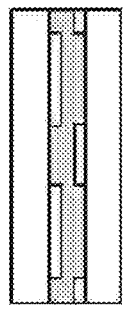
FIGS. 5A to 5B are diagrams illustrating types of a patterned low-refractive layer included in a sunlight concentrating device and corresponding graphs of light-concentration efficiency according to embodiments of the disclosure.
Figure 5A:
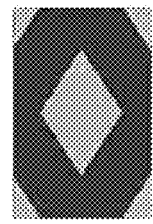
Figure 5A:
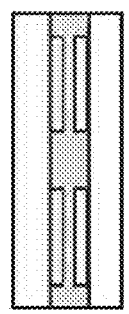
Figure 5A:
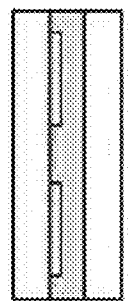
Figure 5A:
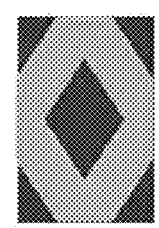
Figure 5A:
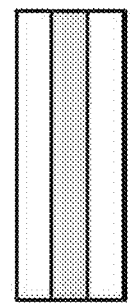
Figure 5B:
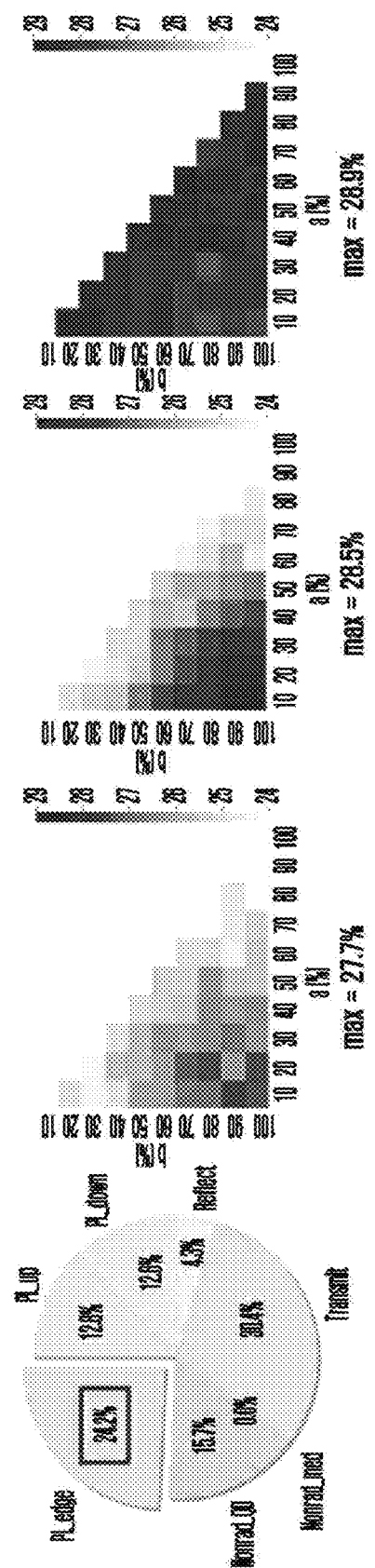

FIGS. 5A to 5B show graphs (FIG. 5B) of the light-concentration efficiency of the sunlight concentrating device 700 depending on the types (FIG. 5A) of the patterned low-refractive layer 740 according to the embodiments of FIGS. 1 to 4.

Efficiency analysis was performed using Monte-Carlo simulation, and its performance conditions (see Table 1 below) and results are as follows.

TABLE 1

| | |
|---|---|
| PL QY | 80% |
| Layer | G/(L)/Q/(L)/G |
| T | 5 mm/(50 μm)/50 μm/(50 μm)/5 mm |
| Size | 50 mm × 50 mm |

If there is no patterned low-refractive layer 740 on a glass having a size of 5 cm×5 cm, the efficiency is about 24% as shown in the first graph of FIG. 5B. However, when the patterned low-refractive layer 740 is provided on one surface of the quantum dot layer 710 as in the embodiment of FIG. 1, the maximum efficiency increases to 27.7% (see the second graph of FIG. 5B) when a predetermined pattern condition described later is satisfied. In addition, when the patterned low-refractive layers 740a and 740b having the same pattern are provided on both surfaces of the quantum dot layer 710 as in the embodiment of FIG. 2, the maximum efficiency rises to 28.5% (see the third graph of FIG. 5B). Also, when the patterned low-refractive layers 740a and 740b having complementary patterns are provided on both surfaces of the quantum dot layer 710 as in the embodiment of FIG. 3, the efficiency reaches a maximum of about 29% (see the fourth graph of FIG. 5B) regardless of the pattern conditions of 'a' and 'b'.

In the rhombus-shaped patterns shown in FIGS. 1 to 3, the predetermined pattern condition may be satisfied when the lengths of 'a' and 'b' shown in FIG. 1 correspond to about 10% and about 90-100%, respectively, of a length from the center to each vertex of the upper or lower surface of the sunlight concentrating device 700.

In Table 1, 'PL QY' denotes a photoluminescence quantum yield, which means the number of carriers produced per photon. The PL QY of each quantum dot of the quantum dot layer 710 used in the disclosure is 80%.

Figure 6A:
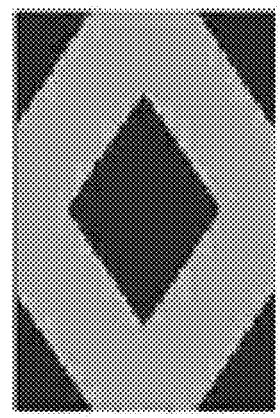
FIGS. 6A to 6B are diagrams illustrating types of a patterned low-refractive layer included in a sunlight concentrating device and corresponding graphs of light-concentration efficiency according to embodiments of the disclosure.
Figure 6A:
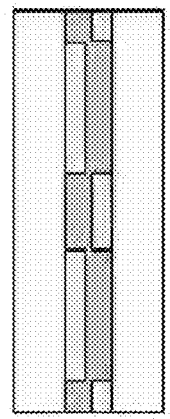
Figure 6A:
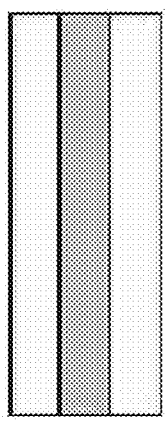
Figure 6B:
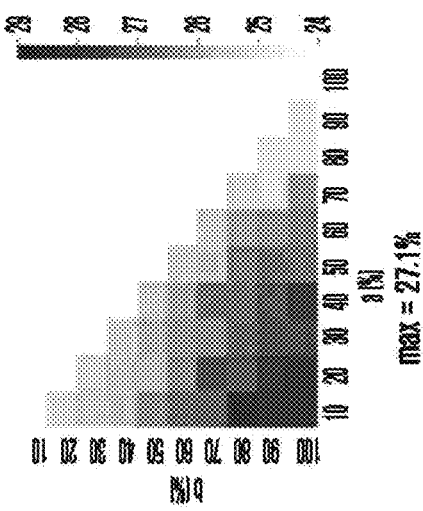
Figure 6B:
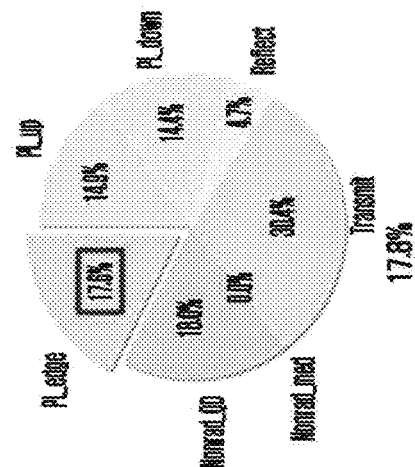

FIGS. 6A to 6B show a change in light-concentration efficiency depending on the degree of patterning a low-refractive layer.

Specifically, as shown in FIG. 6A, efficiency analysis was performed in case where there is no patterned low-refractive layer (left instance of FIG. 6A), in case where the first and second low-refractive layers 740a and 740b having complementary patterns are provided as in the embodiment of FIG. 3 (middle instance of FIG. 6A), and in case where the first and second low-refractive layers 740a and 740b having more complex complementary patterns than those of the embodiment of FIG. 3 are provided (right instance of FIG. 6A).

The efficiency analysis was performed using Monte-Carlo simulation, similar as in FIGS. 5A to 5B, and its performance conditions (see Table 2 below) and results are as follows.

TABLE 2

| | |
|---|---|
| PL QY | 80% |
| Layer | G/(L)/Q/(L)/G |
| T | 6 mm/(50 μm)/50 μm/(50 μm)/6 mm |
| Size | 1 m × 1 m |

If there is no patterned low-refractive layer on a glass having a size of 1 m×1 m, the maximum efficiency is about 17.8% as shown in the first graph in FIG. 6B. However, in case of having a complementary pattern as in the embodiment of FIG. 3, the maximum efficiency rises to 27.1% (see the second graph in FIG. 6B) when a predetermined pattern condition is satisfied. Further, in case of having a more complex complementary pattern, the maximum efficiency is 27.2% (see the third data in FIG. 6B).

The third data in FIG. 6B shows a numerical change of efficiency according to pattern conditions (a, b, c, d) in a more complex complementary rhombus-shaped pattern in relation to predetermined pattern conditions (see a, b in FIG. 1) as described above. In this data, relative lengths of the pattern conditions (a, b, c, d) are indicated when a length from the center to each vertex of the upper or lower surface of the sunlight concentrating device 700 is 10.

As described above, the light-concentration efficiency of the sunlight concentrating device 700 having a size of 5 cm×5 cm increases from about 24% to about 29%, showing an efficiency increase ratio of about 21%. In addition, the light-concentration efficiency of the sunlight concentrating device 700 having a size of 1 m×1 m increases from about 17.8% to about 27.2%, showing an efficiency increase ratio of about 53%.

The predetermined pattern condition in the efficiency analysis performed as shown in FIGS. 6A to 6B is equal to the predetermined pattern condition in the efficiency analysis performed as shown in FIGS. 5A to 5B.

Figure 7:
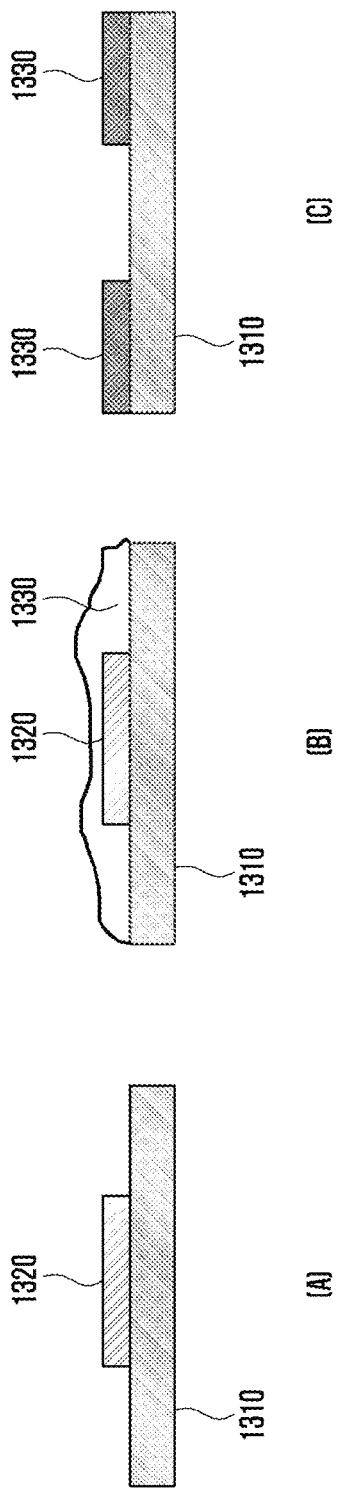
FIG. 7 is a diagram illustrating a method for forming a patterned low-refractive layer according to an embodiment of the disclosure.

FIG. 7 is a diagram illustrating a method 1300 for forming a patterned low-refractive layer according to an embodiment of the disclosure.

Referring to FIG. 7, at the outset, a sacrificial layer 1320 is formed in a desired pattern on a glass 1310 (see (A) of FIG. 7). Next, a low-refractive material 1330 is over-coated at 300 rpm through a spin coating process and then soft-baked at a temperature of 90 degrees for 90 seconds (see (B) of FIG. 7). Next, the sacrificial layer 1320 is removed together with a portion of the deposited low-refractive material 1330 through a lift-off process, and the other portion of the deposited low-refractive material 1330 forms a patterned low-refractive layer 1330 through a hard baking process performed at a temperature of 220 degrees for 20 minutes (see (C) of FIG. 7). Thereafter, a quantum dot layer is coated on the glass 1310 having the patterned low-refractive layer 1330 formed thereon, and then another glass 1310 that either has or does not have the patterned low-refractive layer 1330 shown in FIG. 7 is bonded to the quantum dot layer. As a result, the sunlight concentrating device 700 including the patterned low-refractive layer 740 shown in FIGS. 1 to 4 is obtained.

Figure 9:
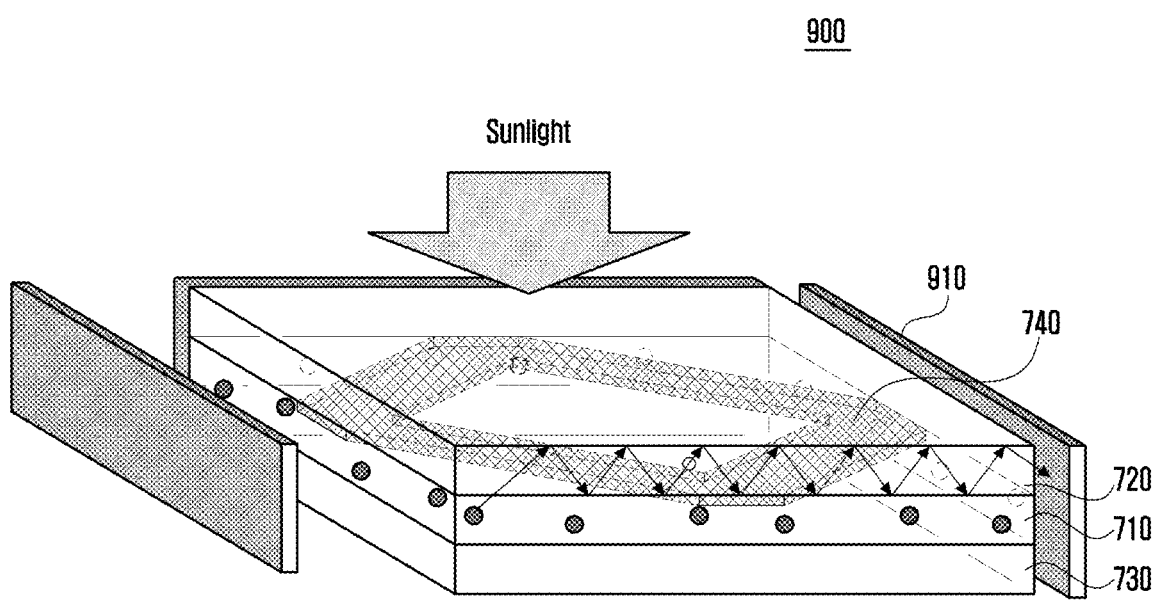
FIG. 9 is a diagram illustrating an operating state of a sunlight concentrating device according to an embodiment of the disclosure.

The above-described sunlight concentrating device 700 including a structure in which the patterned low-refractive layer 740 is provided on the quantum dot layer 710 or formed in the transparent polymer resin layer 750 may be used for a photovoltaic module 900 as shown in FIG. 9.

Specifically, the photovoltaic module 900 according to an embodiment of the disclosure shown in FIG. 9 may include a plurality of solar photovoltaic cells 910 disposed in a form surrounding sides of the above-described sunlight concentrating device 700 shown in FIG. 1 and electrically connected thereto. However, those skilled in the art can understand that the plurality of solar photovoltaic cells 910 may also be disposed in a form surrounding sides of the sunlight concentrating device 700 shown in FIGS. 2 to 4.

For example, when the sunlight concentrating device 700 has a rectangular planar shape, the plurality of solar photovoltaic cells 910 may be disposed in a form surrounding four sides of the sunlight concentrating device 700. In addition, the plurality of solar photovoltaic cells 910 may be electrically connected to each other in parallel or in series. The solar photovoltaic cell 910 may be, but not limited to, a silicon (Si)-based or gallium arsenide (GaAs)-based solar photovoltaic cell.

While the disclosure has been particularly shown and described with reference to exemplary embodiments thereof, it will be understood by those skilled in the art that various changes in form and details may be made therein without departing from the scope of the subject matter as defined by the appended claims.

What is claimed is:

1. A sunlight concentrating device comprising:
   a quantum dot layer having a first surface and a second surface opposite to each other;
   a first glass layer in contact with the first surface of the quantum dot layer;
   a second glass layer in contact with the second surface of the quantum dot layer; and
   a low-refractive layer provided in a predetermined region of the first surface or the second surface of the quantum dot layer,
   wherein the low-refractive layer is patterned, and
   wherein a refractive index of the low-refractive layer is smaller than a refractive index of the quantum dot layer.

2. The sunlight concentrating device of claim 1, wherein the low-refractive layer comprises a first low-refractive layer and a second low-refractive layer respectively provided in predetermined regions of the first surface and the second surface of the quantum dot layer, and wherein each of the first and second low-refractive layers is patterned, and a refractive index of each of the first and second low-refractive layers is smaller than a refractive index of the quantum dot layer.

3. The sunlight concentrating device of claim 1, wherein the low-refractive layer comprises a first low-refractive layer and a second low-refractive layer respectively provided in predetermined regions of the first surface and the second surface of the quantum dot layer, and wherein the first low-refractive layer and the second low-refractive layer are respectively patterned on the first and second surfaces of the quantum dot layer to have complementary patterns, and wherein a refractive index of each of the first and second low-refractive layers is smaller than a refractive index of the quantum dot layer.

4. A sunlight concentrating device comprising:
   a quantum dot layer having a first surface and a second surface opposite to each other;
   a transparent polymer resin layer in contact with one of the first and second surfaces of the quantum dot layer;
   a first glass layer in contact with the transparent polymer resin layer and opposite to the quantum dot layer;
   a second glass layer in contact with other of the first and second surfaces of the quantum dot layer; and
   a low-refractive layer provided in the transparent polymer resin layer,
   wherein the low-refractive layer is patterned, and
   wherein a refractive index of the low-refractive layer is smaller than a refractive index of the quantum dot layer.

5. The sunlight concentrating device of claim 4, further comprising:
   another transparent polymer resin layer in which another low-refractive layer is provided is interposed between the second glass layer and other of the first and second surfaces.

6. The sunlight concentrating device of claim 4, wherein the low-refractive layer is implemented as a plurality of patterned low-refractive layers provided in the transparent polymer resin layer and vertically spaced apart from each other, and wherein each of the plurality of patterned low-refractive layers has a refractive index smaller than a refractive index of the quantum dot layer.

7. The sunlight concentrating device of claim 1, wherein a total area of the patterned low-refractive layer corresponds to a range of 10% to 90% of a total area of the first glass layer or the second glass layer.

8. The sunlight concentrating device of claim 2, wherein a total area of the patterned low-refractive layer corresponds to a range of 10% to 90% of a total area of the first glass layer or the second glass layer.

9. The sunlight concentrating device of claim 3, wherein a total area of the patterned low-refractive layer corresponds to a range of 10% to 90% of a total area of the first glass layer or the second glass layer.

10. The sunlight concentrating device of claim 4, wherein a total area of the patterned low-refractive layer corresponds to a range of 10% to 90% of a total area of the first glass layer or the second glass layer.

11. The sunlight concentrating device of claim 1, wherein a thickness of the glass layers is 50 times or more of a thickness of the quantum dot layer.

12. The sunlight concentrating device of claim 2, wherein a thickness of the glass layers is 50 times or more of a thickness of the quantum dot layer.

13. The sunlight concentrating device of claim 3, wherein a thickness of the glass layers is 50 times or more of a thickness of the quantum dot layer.

14. The sunlight concentrating device of claim 4, wherein a thickness of the glass layers is 50 times or more of a thickness of the quantum dot layer.

15. The sunlight concentrating device of claim 1, wherein the low-refractive layer includes at least one selected from the group consisting of hollow silica particles, hollow titanium dioxide particles, and fluorine-based compounds.

16. The sunlight concentrating device of claim 2, wherein the low-refractive layer includes at least one selected from the group consisting of hollow silica particles, hollow titanium dioxide particles, and fluorine-based compounds.

17. The sunlight concentrating device of claim 3, wherein the low-refractive layer includes at least one selected from the group consisting of hollow silica particles, hollow titanium dioxide particles, and fluorine-based compounds.

18. The sunlight concentrating device of claim 4, wherein the low-refractive layer includes at least one selected from the group consisting of hollow silica particles, hollow titanium dioxide particles, and fluorine-based compounds.

19. The sunlight concentrating device of claim 4, wherein the patterned low-refractive layer is composed of 20 layers or less.

20. A photovoltaic module comprising a plurality of solar photovoltaic cells disposed in a form surrounding sides of a sunlight concentrating device and electrically connected thereto,
wherein the sunlight concentrating device comprises:
a quantum dot layer having a first surface and a second surface opposite to each other;
a first glass layer in contact with the first surface of the quantum dot layer;
a second glass layer in contact with the second surfaces of the quantum dot layer; and
a low-refractive layer provided in a predetermined region of the first surface or the second surface of the quantum dot layer,
wherein the low-refractive layer is patterned, and
wherein a refractive index of the low-refractive layer is smaller than a refractive index of the quantum dot layer.

21. The photovoltaic module of claim 20, wherein the low-refractive layer comprises a first low-refractive layer and a second low-refractive layer respectively provided in predetermined regions of the first surface and the second surface of the quantum dot layer, and wherein each of the first and second low-refractive layers is patterned, and a refractive index of each of the first and second low-refractive layers is smaller than a refractive index of the quantum dot layer.

22. The photovoltaic module of claim 20, wherein the low-refractive layer comprises a first low-refractive layer and a second low-refractive layer respectively provided in predetermined regions of the first surface and the second surface of the quantum dot layer, wherein the first low-refractive layer and the second low-refractive layer are respectively patterned on the first and second surfaces of the quantum dot layer to have complementary patterns, and wherein a refractive index of each of the first and second low-refractive layers is smaller than a refractive index of the quantum dot layer.

23. A photovoltaic module comprising a plurality of solar photovoltaic cells disposed in a form surrounding sides of the sunlight concentrating device of claim 4 and electrically connected thereto.

* * * * *